(12) United States Patent
Brau et al.

(10) Patent No.: US 7,492,153 B2
(45) Date of Patent: Feb. 17, 2009

(54) SYSTEM AND METHOD OF PARALLEL IMAGING WITH CALIBRATION TO A SEPARATE COIL

(75) Inventors: Anja C. S. Brau, Menlo Park, CA (US); Philip James Beatty, Menlo Park, CA (US); Dwight G. Nishimura, Palo Alto, CA (US)

(73) Assignees: General Electric Company, Schenectady, NY (US); Board of Trustees of the Leland Stanford, Jr. University, Palo Alto, CA (US)

( * ) Notice: Subject to any disclaimer, the term of this patent is extended or adjusted under 35 U.S.C. 154(b) by 0 days.

(21) Appl. No.: 11/757,571

(22) Filed: Jun. 4, 2007

(65) Prior Publication Data

US 2008/0297152 A1 Dec. 4, 2008

(51) Int. Cl.
*G01V 3/00* (2006.01)
(52) U.S. Cl. .................................. 324/309; 324/307
(58) Field of Classification Search ................. 324/309, 324/307, 306, 318, 322
See application file for complete search history.

(56) References Cited

U.S. PATENT DOCUMENTS

| | | | | |
|---|---|---|---|---|
| 5,587,656 | A | * | 12/1996 | Van Heels-Bergen et al. .... 324/307 |
| 5,600,244 | A | * | 2/1997 | Jensen et al. ................. 324/309 |
| 6,289,232 | B1 | | 9/2001 | Jakob et al. |
| 6,841,998 | B1 | | 1/2005 | Griswold |
| 7,197,353 | B2 | * | 3/2007 | King et al. ................... 600/410 |

OTHER PUBLICATIONS

K.P. Pruessmann et al., "Sense: Sensitivity Encoding for Fast MRI," MRM 42:952-962, 1999.
M.A. Griswold et al., "Generalized Autocalibrating Partially Parallel Acquisitions (GRAPPA)," MRM 47:1202-1210, 2002.
M.A. Griswold et al., "Field-of-View Limitations in Parallel Imaging," MRM 52:1118-1126, 2004.
R.M. Heidemann et al., "VD-Auto-Smash Imaging," MRM 45:1066-1074, 2001.
A.C. Brau et al., "Efficient Computation of Autocalibrating Parallel Imaging Reconstructions," ISMRM 2006.

* cited by examiner

*Primary Examiner*—Louis M Arana
(74) *Attorney, Agent, or Firm*—Ziolkowski Patent Solutions Group, SC (57) ABSTRACT

An RF coil assembly includes a plurality of RF source coils and an RF target coil separate from the plurality of RF source coils. A computer is programmed to acquire MR data of an imaging object from each of the plurality of RF source coils and to acquire MR data of the imaging object from the RF target coil. The computer is further programmed to calculate a set of weights based on a relationship between MR data acquired from each RF source coil and MR data acquired from the RF target coil and to reconstruct an image based on an application of the set of weights to at least a portion of the MR data acquired from each of the plurality of RF source coils.

27 Claims, 6 Drawing Sheets

FIG. 6

SYSTEM AND METHOD OF PARALLEL IMAGING WITH CALIBRATION TO A SEPARATE COIL

BACKGROUND OF THE INVENTION

The present invention relates generally to magnetic resonance (MR) imaging and, more particularly, to a flexible approach for sampling and reconstructing an image of an imaging volume with multiple receiver coils to accelerate data acquisition.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

One technique that has been developed to accelerate MR data acquisition is commonly referred to as "parallel imaging" or "partial parallel imaging". In parallel imaging, multiple receive coils acquire data from a region or volume of interest. Thus, parallel imaging is used to accelerate data acquisition in one or more dimensions by exploiting the spatial dependence of phased array coil sensitivity. Parallel imaging has been shown to be successful in reducing scan time, but also reducing image blurring and geometric distortions. Moreover, parallel imaging can be used to improve spatial or temporal resolution as well as increased volumetric coverage.

There are several types of parallel imaging (PI) reconstruction methods that have been developed to generate the final, unaliased image from accelerated data. These methods can generally be divided into two categories based on how they treat the reconstruction problem: 1) SENSE-based techniques (Sensitivity Encoding) estimate coil sensitivity profiles from low-resolution calibration images, which can then be used to unwrap aliased pixels in image space using a direct inversion algorithm; and 2) autocalibrating PI-based methods, such as GRAPPA (Generalized Auto-calibrating Partially Parallel Acquisition) and ARC (Autocalibrating Reconstruction for Cartesian sampling), that calculate reconstruction weights necessary to synthesize unacquired data directly from acquired data using an algorithm that does not require coil sensitivity estimates. The reconstruction weights for GRAPPA and ARC are calculated from a small amount of fully sampled calibration data that is typically embedded within the scan ("auto-calibration"), but can also be acquired before or after the scan. Thus, GRAPPA and ARC exploit receiver coil sensitivity variation to accelerate data acquisition and synthesize the missing data using pre-calculated calibration information obtained from the particular imaging setup. While both SENSE- and autocalibrating PI-based approaches have been successful, in practice, autocalibrating PI-based techniques have been shown to be preferred when accurate coil sensitivity estimates cannot be obtained, for example, in reduced FOV applications, and because they exhibit relatively benign image artifacts across a variety of applications.

However, a disadvantage of GRAPPA-based techniques is that they are computationally expensive because they are per-coil reconstructions. In conventional GRAPPA-based techniques, a complete dataset for each receiver coil is reconstructed from the accelerated data from that coil and the accelerated data from at least one other coil. The linear combination weights needed to perform the reconstruction are calculated during an initial training phase. The training phase is performed using a small amount of fully sampled calibration data that is acquired on each receiver coil either before, during, or after the accelerated scan. The reconstruction weights are determined by fitting the calibration data from all coils to the calibration data on a single coil in the group. This process is repeated for each coil in the group.

In other words, for GRAPPA-based techniques, each individual coil dataset is reconstructed using information from a plurality of coils. The multiple separate coil images can then be combined via a sum-of-squares reconstruction to create a final composite image. While performing a per-coil reconstruction eliminates the phase cancellation problems observed in implementations such as VD-AUTO-SMASH, it introduces a significant computation burden. Specifically, the computational expense of GRAPPA-based methods is proportional to $N_c^2$, where $N_c$ is the number of surface coils. Thus, the computation time scales exponentially as the number of coils increases.

It would therefore be desirable to have a system and method capable of retaining the image quality benefit of GRAPPA-based methods while reducing the computation requirement.

BRIEF DESCRIPTION OF THE INVENTION

The present invention provides a system and method of parallel imaging that overcome the aforementioned drawbacks. Weights for synthesizing data from a plurality of RF coils are calculated using data acquired in the plurality of RF coils as well as data acquired in at least one other RF coil that is not one of the plurality of RF coils. The weights are determined based on a relationship between the data from the plurality of RF coils to the data from the at least one other RF coil.

In accordance with an aspect of the invention, an MRI apparatus includes a magnetic resonance imaging (MRI) system having a plurality of gradient coils positioned about a bore of a magnet. The MRI apparatus also includes an RF transceiver system to acquire MR data from an RF coil assembly. The RF coil assembly includes a plurality of RF source coils and an RF target coil separate from the plurality of RF source coils. A computer is included and programmed to acquire MR data of an imaging object from each of the plurality of RF source coils and to acquire MR data of the imaging object from the RF target coil. The computer is further programmed to calculate a set of weights based on a relationship between MR data acquired from each RF source coil and MR data acquired from the RF target coil and to reconstruct an image based on an application of the set of weights to at least a portion of the MR data acquired from each of the plurality of RF source coils.

In accordance with another aspect of the invention, a method of MR imaging includes acquiring a first set of MR calibration signals from excited nuclei in a subject to be scanned from each of a plurality of RF analysis coils and acquiring a second set of MR calibration signals from the excited nuclei from an RF synthesis coil, wherein the RF synthesis coil is not one of the plurality of RF analysis coils. The method also includes generating a plurality of synthesis weights based on the relationship between the first and second sets of MR calibration signals. A set of accelerated MR data is acquired from the excited nuclei from each of the plurality of RF analysis coils. The method also includes reconstructing an image from an application of the plurality of synthesis weights to the sets of accelerated MR data.

In accordance with another aspect of the invention, a computer readable storage medium having a program stored thereon that when executed by a processor causes the processor to access a first set of MR data of an imaging object acquired from each of at least two RF source coils and access a second set of MR data of the imaging object acquired from each of at least one RF target coil, the at least one RF target coil different than the at least two RF source coils. Each first set of MR data is related to each second set of MR data to calculate a series of weights, and the series of weights is stored in memory.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

The present invention is directed to a parallel imaging reconstruction technique that reduces the cost of applying the weights to reconstruct an image. The technique is applicable to numerous parallel imaging methods and is used for efficiently reconstructing a magnetic resonance (MR) image.

K-space is well-known in the art of MR imaging as a matrix that functions as, or is equivalent to, a "frequency domain" repository for positive and negative spatial frequency values that are encoded as complex numbers, e.g., a+bi, i=sqrt(−1). That is, the k-space matrix is generally recognized as the repository for spatial frequency signals acquired during evolution and decay of an MR echo. The k-space matrix is typically filled with frequency encoded data in the $k_x$ direction by a frequency encode gradient and in the $k_y$ direction by a phase encode gradient, and can also include phase encoded data in the $k_z$ direction by a second phase encode gradient. Data acquired from the echo is deposited in the k-space matrix in a row, specifically determined by the frequency and phase encode gradient strengths applied during MR signal evolution. K-space is generally filled one row at a time in a Cartesian manner. After all the k-space has been acquired, the elements of the k-space matrix contain positionally-dependent phase change variations along the $k_x$ (frequency encode) and $k_y$ (phase encode) direction. A 2D inverse Fourier transform decodes the frequency domain information. The 2D Fourier transform is a two step process. First, a row-by-row 1D Fourier transform converts each row of k-space data. After the row-by-row Fourier transform, a column-by-column 1D Fourier transform is performed. Collectively, the pair of 1D Fourier transforms converts the k-space data from the frequency domain (k-space data) to the spatial domain (image space data). An image is then reconstructed from the image matrix illustrating spatial and contrast characteristics of the object imaged.

Figure 1:
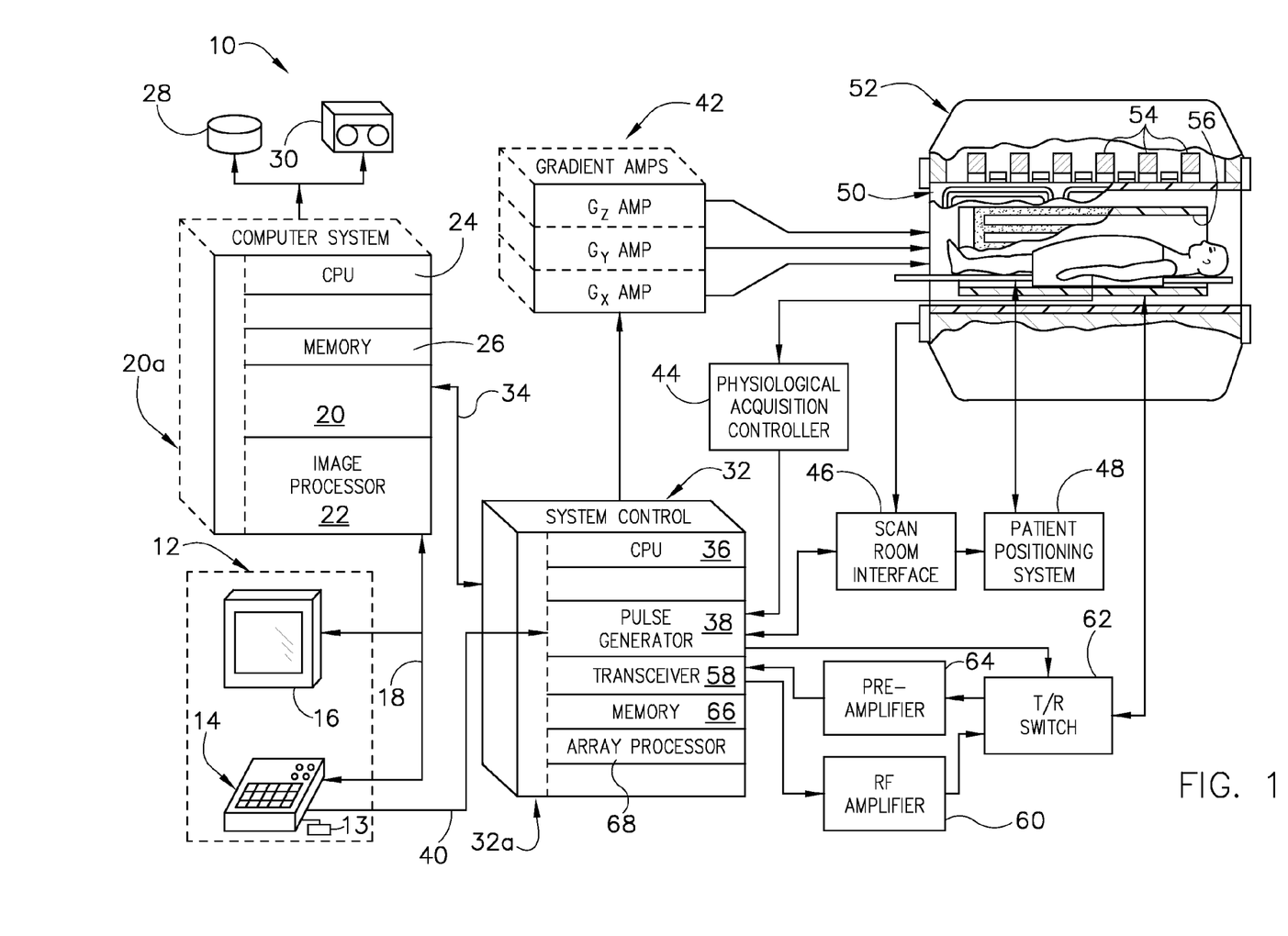
FIG. 1 is a schematic block diagram of an MR imaging system incorporating the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The MR system described in FIG. 1 may also be equipped with a receive coil array that picks up the MR signals. Such coil arrays are well-known in the art and include whole body arrays as well as partial body arrays, such as head coil arrays, cardiac coil arrays, and spine coil arrays. As will be described, the invention includes a parallel imaging method wherein a region or volume of interest is sampled with an array of RF receive coils. The array of RF receive coils includes one or more source or analysis coils and one or more target for synthesis coils. In this regard, the invention is not limited to a particular coil array type or orientation.

As is known in the art of parallel imaging, the sensitivity of each receiver coil element to the field-of-view (FOV) can be exploited to accelerate the data acquisition process (i.e., perform an accelerated scan). The image data of each coil are multiplied by the coil sensitivity inherent to each coil element. The corresponding k-space data are convolved with the Fourier Transform of the spatial coil sensitivity distribution. The spatial coil sensitivity variation imposed by the individual receive coils provides additional spatial encoding functionality complementary to regular gradient encoding that is the basis of all parallel imaging methods. In 2D imaging, that sensitivity is exploited to reduce the number of phase encoding steps in one dimension or direction. In 3D imaging, that sensitivity can be exploited to reduce the number of phase encoding steps in up to two dimensions or directions. Since, in practice, it can be extremely difficult to accurately measure the coil sensitivity inherent to each coil element, autocalibrating techniques are often implemented for parallel imaging.

Figure 2:
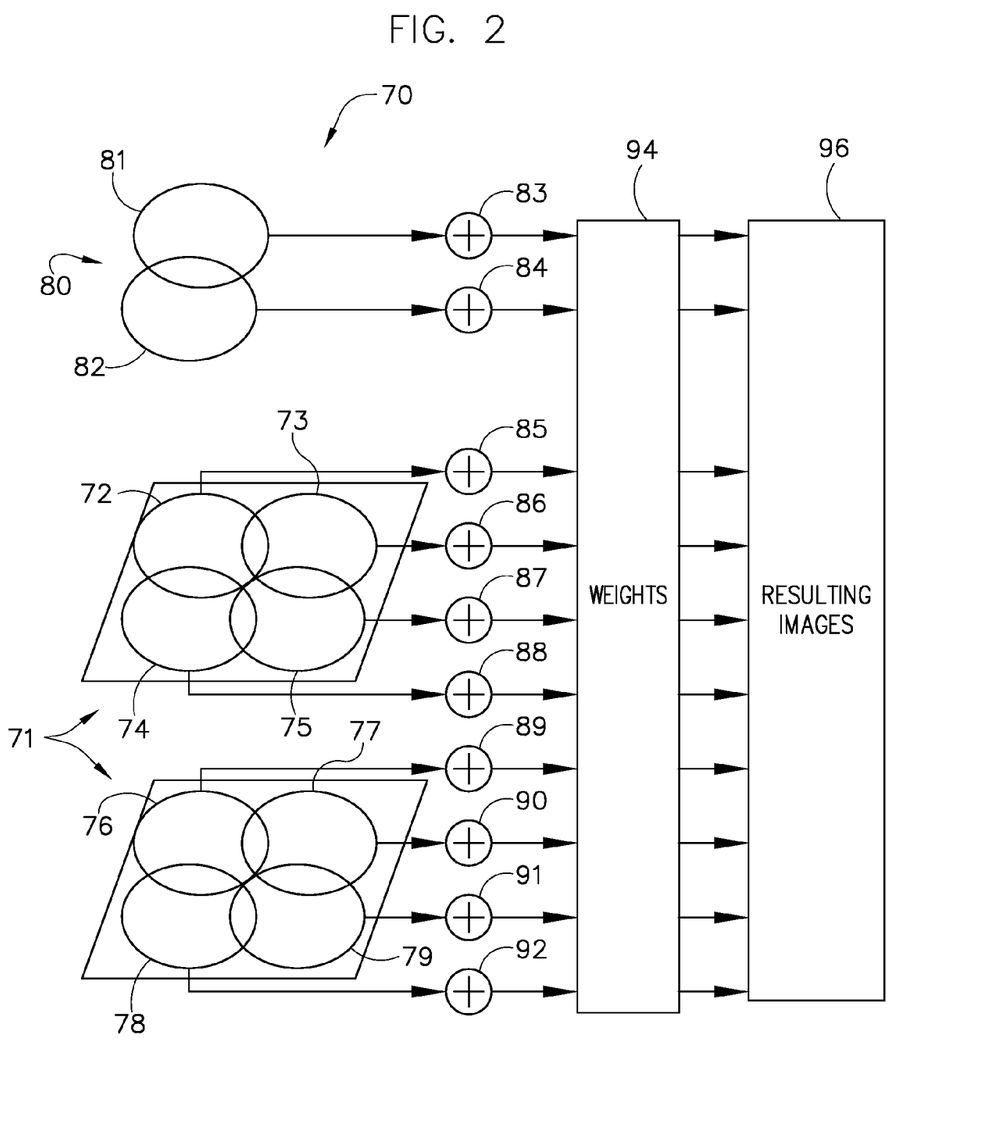
FIG. 2 is a schematic diagram of an autocalibrating parallel imaging technique according to an embodiment of the present invention.

Referring now to FIG. 2, a schematic representation of an RF coil array 70 useful in an autocalibrating parallel imaging technique according to an embodiment of the present invention is illustrated. RF coil array 70 includes an array of source coils 71 used to acquire calibration and imaging data for a FOV and includes eight separate surface coil elements 72-79. In a preferred embodiment, the imaging data represents data from a reduced FOV. RF coil array 70 also includes an array of target coils 80 used to acquire calibration data for the FOV and, as shown, includes two separate coil elements 81, 82. It is contemplated, however, that the array of target coils 80 may include more or less than two coil elements and that the array of source coils 71 may include more or less than eight coil elements. The number of separate coil elements 72-79, 81, 82 shown in FIG. 2 is merely an illustrative example, and the present invention is not limited to only the number of separate coil elements shown.

Each coil element 72-79, 81, 82 samples the FOV by detecting changes in excited nuclei in the FOV and transmits signals indicative of that which is detected to separate data acquisition channels 83-92, respectively. In one embodiment, calibration data from each channel 83-92 is used to generate synthesis or linear combination weights 94 to calibration data from each channel 83, 84. Thereafter, a respective coil image 96 for each target coil 81, 82 is calculated from the synthesis weights 92 for the respective target coil 81, 82 and the imaging data acquired in coil elements 72-79 of the array of source coils 71. One skilled in the art will appreciate that the images 96 from each target coil 81, 82 may also be combined into a single, composite image using one of a number of known summation techniques, e.g., sum of squares.

Figure 3:
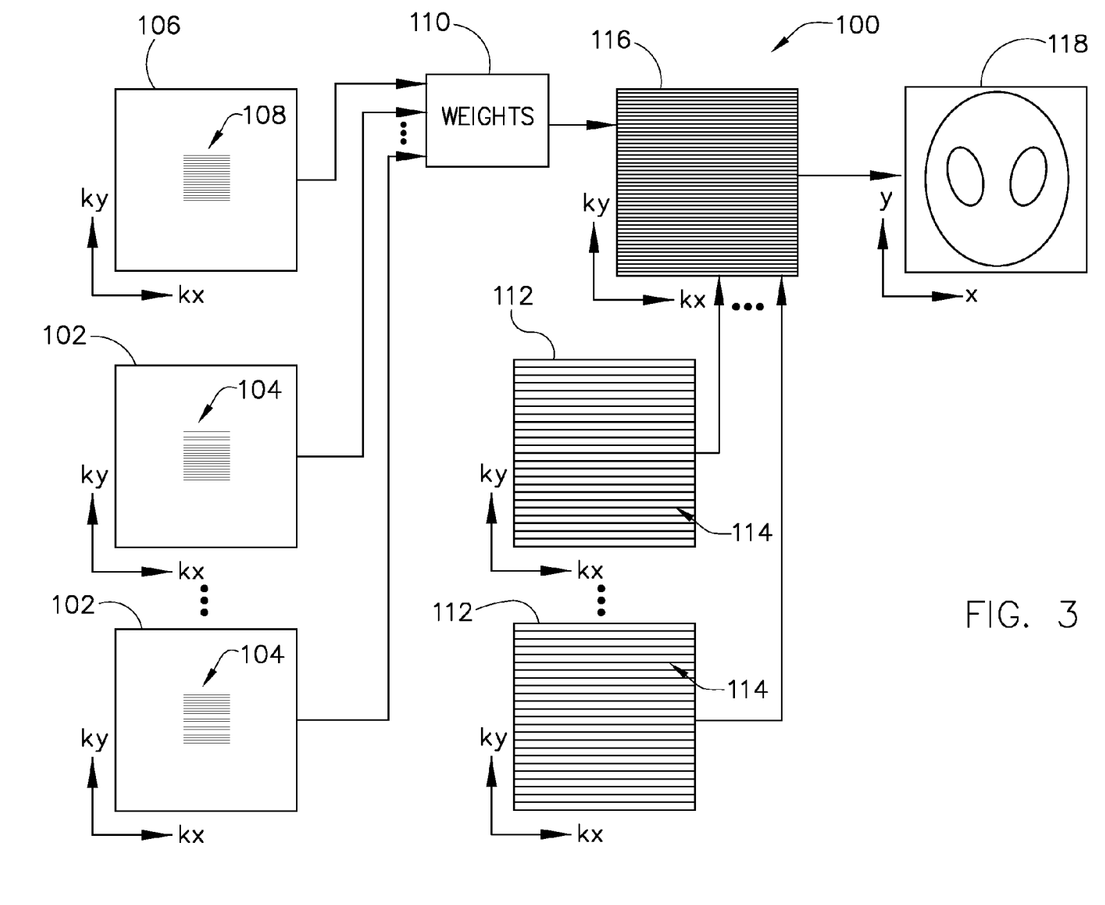
FIG. 3 is a schematic diagram of an autocalibrating parallel imaging technique according to an embodiment of the present invention.

FIG. 3 shows a schematic diagram of an autocalibrating parallel imaging technique 100 according to an embodiment of the present invention. Technique 100 includes the acquisition of calibration data in a plurality of source coils. Magnetic spins of an imaging object or subject, such as the subject shown in FIG. 1, are excited such that a large signal may be acquired therefrom. Thereafter, a k-space data set 102 for each source coil is populated with low resolution, full FOV k-space calibration data 104 having a high contrast acquired in each respective source coil.

Technique 100 also includes the acquisition of calibration data in a target coil. The target coil is not used to acquire imaging data. That is, accelerated data from the target coil itself is not acquired. In an embodiment of the invention, the target coil is a body coil, such as the whole-body RF coil 56 of MRI system 10, which has a homogeneous sensitivity region. Accordingly, images reconstructed from calibration data acquired using a body coil have improved compensation for surface coil sensitivity variations. Alternatively, in another embodiment of the invention, the target coil maybe a large target surface coil which may have a more localized sensitivity region than a body coil.

Magnetic spins of the imaging object are excited such that signals acquired therefrom have the same or substantially similar contrast as the signals from which data is acquired in the source coils. Thereafter, a k-space data set 106 for the target coil is populated with low resolution, full FOV k-space calibration data 108 acquired in the target coil. In an embodiment of the invention, the source coils and the target coil acquire their respective calibration data 104, 108 from the same excitation of the magnetic spins. Alternatively, the target coil may acquire calibration data 108 from an excitation of the magnetic spins before or after the excitation of the magnetic spins from which the source coils acquire calibration data 104.

Synthesis or linear combination weights 110 are calculated from a relationship between the calibration data 104 and the calibration data 108. In this manner, linear combination weights are generated that will synthesize k-space data on the target coil from k-space data on the source coils. In one embodiment of the present invention, synthesis weights 110 are generated directly by fitting calibration data 104 from each source coil to the calibration data 108 of the target coil according to known methods. In another embodiment of the present invention, it is envisioned that linear combination weights can be generated from complex valued numbers, identified herein as "correlation values." Correlation values are generated by way of an intermediate calculation that is performed using the calibration data. That is, a correlation value is generated that relates two encoding locations (or encoding vectors) to each other, the encoding locations being selected from calibration data that has been plotted in k-space on a Kx-Ky plane. Each encoding location is specified by a pair of values, (j, k), that are defined by an integer coil index, j, that corresponds with a specified receiver coil in the RF coil array, and a k-space location, k. These correlation values are entered into one or more systems of linear equations to determine the linear combination weights 110.

Still referring to FIG. 3, technique 100 includes the population of k-space data sets 112 for each source coil. Magnetic spins of the imaging object are excited such that signals acquired therefrom have a diagnostically useful contrast that may have a different signal-to-noise ratio (SNR) and/or contrast than the signals from which calibration data 104, 108 is acquired. Thereafter, each k-space data set 112 is populated with a full resolution, reduced FOV data set 114 acquired in an accelerated scan. It is contemplated that the reduced FOV data sets 114 may be acquired before, during, or after acquisition of the calibration data 104, 108.

Technique 100 includes using the weights 110 to construct a full resolution, full FOV k-space data set 116 for the target coil. In an embodiment of the invention, k-space data set 116 is generated from a linear combination of the application of the weights 110 to the data in each k-space data set 112. Thereafter, a 2D Fourier transform is applied to k-space data set 116 to reconstruct an image 118.

Figure 4:
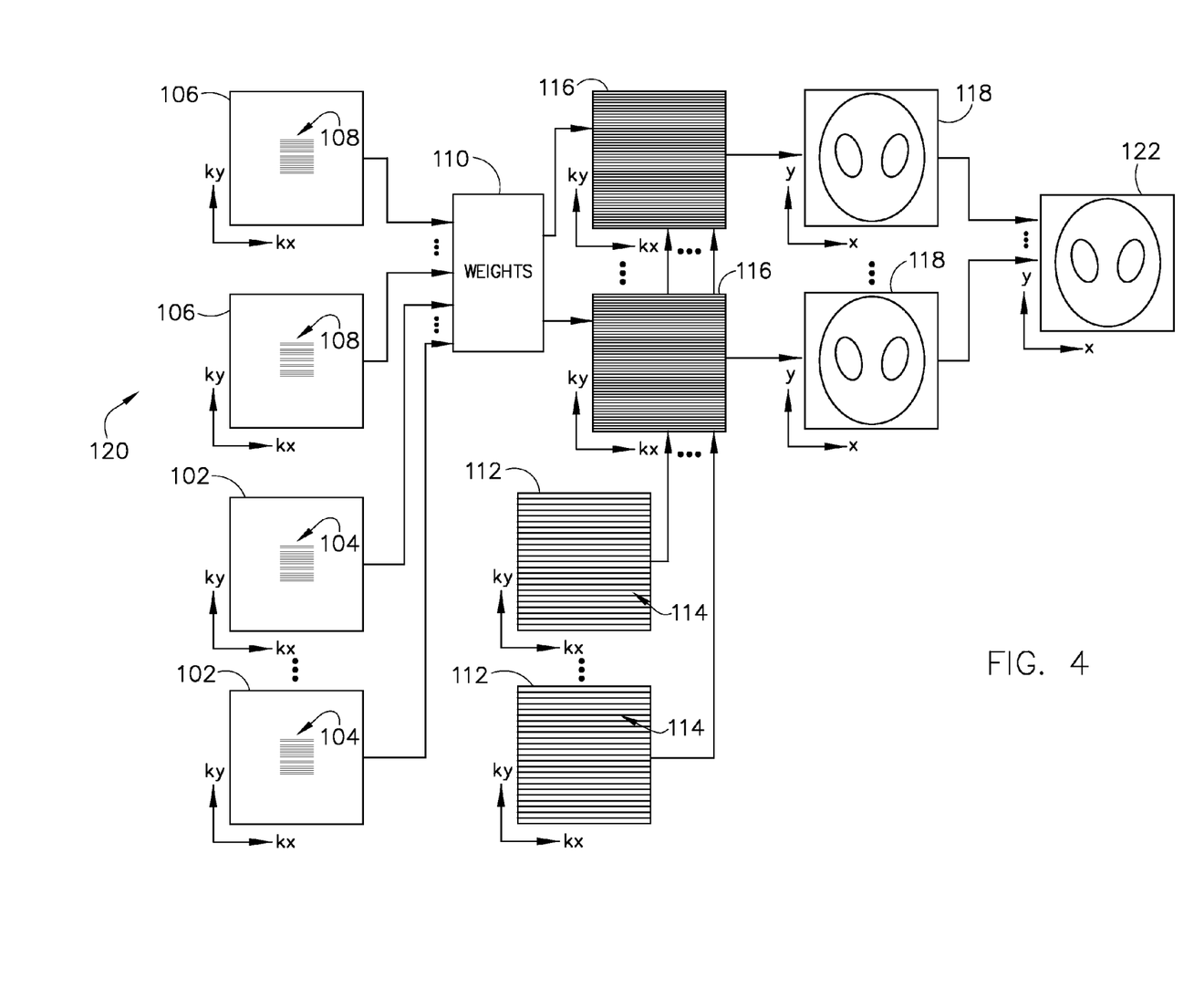
FIG. 4 is a schematic diagram of an autocalibrating parallel imaging technique according to another embodiment of the present invention.

FIG. 4 shows a schematic diagram of an autocalibrating parallel imaging technique 120 according to another embodiment of the present invention. The technique 120 shown in FIG. 4 is similar to that shown in FIG. 3 with the addition of multiple target coils. Each target coil has a respective k-space data set 106 populated with calibration data 108. The synthesis weights 110 include weights calculated from a relationship between the calibration data 104 to the calibration data 108 of each target coil. A full resolution, full FOV k-space data set 116 for each target coil is also constructed to which a 2D Fourier transform is applied to reconstruct an image 118 for each target coil. Additionally, as described in FIG. 2, the images 118 from each target coil may be combined into a single, composite image 122 using one of a number of known summation techniques, e.g., sum of squares.

Figure 5:
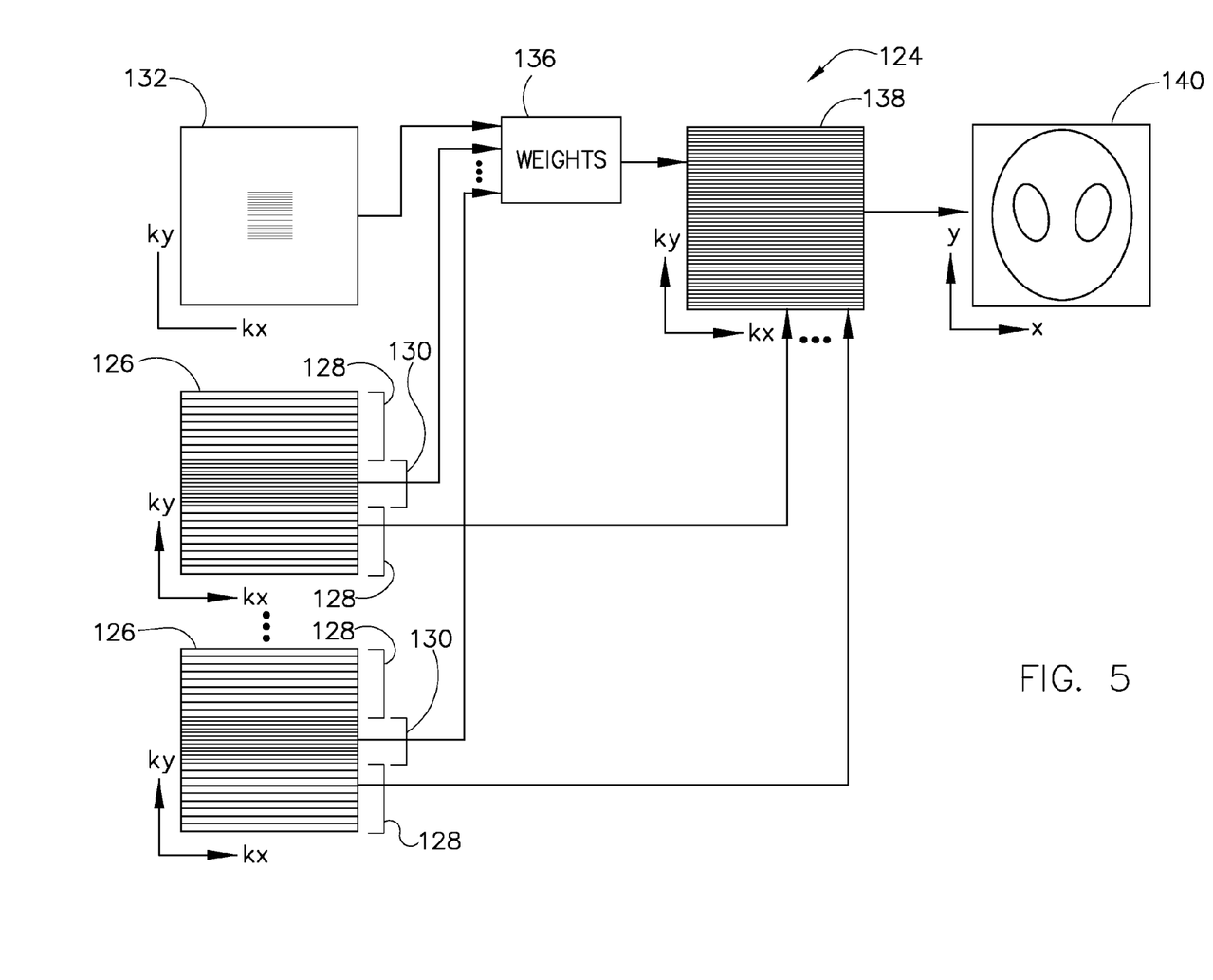
FIG. 5 is a schematic diagram of an autocalibrating parallel imaging technique according to another embodiment of the present invention.

FIG. 5 shows a schematic diagram of an autocalibrating parallel imaging technique 124 according to another embodiment of the present invention. Technique 124 includes exciting magnetic spins of an imaging object such that a large signal may be acquired therefrom. Thereafter, a k-space data set 126 for each source coil is populated with a full resolution, reduced FOV data set 128 acquired in an accelerated scan having a diagnostically useful contrast. Each k-space data set 126 is also simultaneously populated with low resolution, calibration data 130. In this manner, acquisitions of accelerated data and calibration data may be combined.

Technique 124 also includes the acquisition of calibration data in a target coil. In an embodiment of the invention, the target coil is a body coil. Magnetic spins of the imaging object are excited, and a k-space data set 132 for the target coil is populated with low resolution, full FOV k-space calibration data 134 acquired in the target coil having a diagnostically useful contrast. In an embodiment of the invention, the source coils and the target coil acquire their respective data 128, 130, 134 from the same excitation of the magnetic spins. Alternatively, the target coil may acquire calibration data 134 from an excitation of the magnetic spins before or after the excitation of the magnetic spins from which the source coils acquire data for the reduced FOV data set 128 and/or calibration data 130.

Synthesis or linear combination weights 136 are calculated from a relationship between the calibration data 130 and the calibration data 132 as described above with respect to FIG. 3. In this manner, linear combination weights 136 are generated that will synthesize k-space data on the target coil from k-space data on the source coils. The weights 136 are used to construct a full resolution, full FOV k-space data set 138 for the target coil. In an embodiment of the invention, k-space data set 138 is generated from a linear combination of the application of the weights 136 to each k-space data set 126. Thereafter, a 2D Fourier transform is applied to k-space data set 138 to reconstruct an image 140.

It is contemplated that an embodiment of technique 124 may include multiple target coils (not shown). Accordingly, as described with respect to FIG. 4, each target coil of technique 124 would have a corresponding k-space data set 132 populated with calibration data 134 for that target coil. Additionally, the synthesis weights 136 would include weights calculated from a relationship between the calibration data 130 to the calibration data 134 of each target coil. A full resolution, full FOV k-space data set 138 for each target coil would also be constructed to which a 2D Fourier transform would be applied to reconstruct an image 140 for each target coil. Furthermore, the images 140 from each target coil may be combined into a single, composite image (not shown) using one of a number of known summation techniques, e.g., sum of squares.

Figure 6:
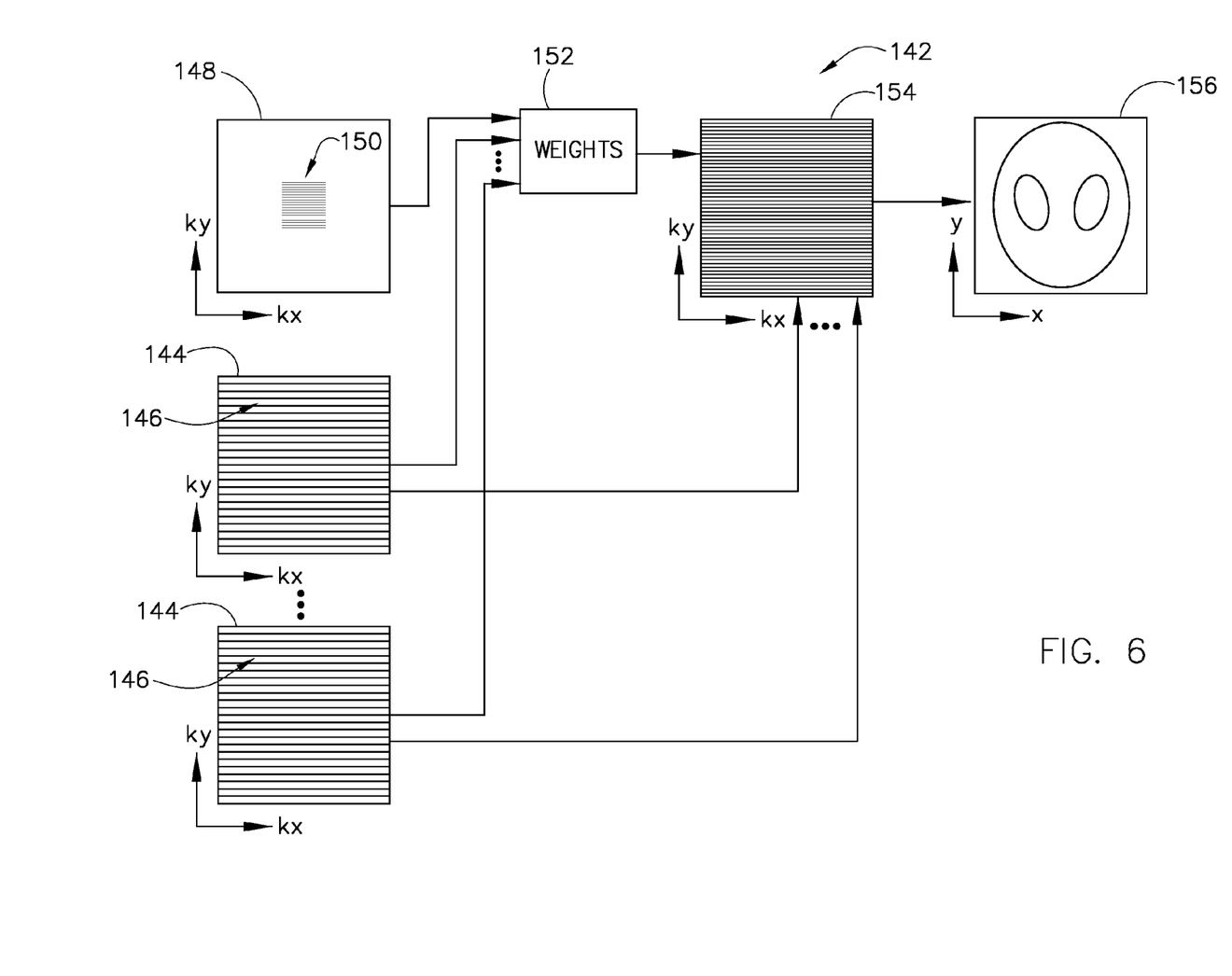
FIG. 6 is a schematic diagram of an autocalibrating parallel imaging technique according to another embodiment of the present invention.

FIG. 6 shows a schematic diagram of an autocalibrating parallel imaging technique 142 according to another embodiment of the present invention. Technique 142 includes exciting magnetic spins of an imaging object such that a large signal may be acquired therefrom. Thereafter, a k-space data set 144 for each source coil is populated with a full resolution, reduced FOV data set 146 acquired in an accelerated scan having a diagnostically useful contrast.

Technique 142 also includes the acquisition of calibration data in a target coil. In an embodiment of the invention, the target coil is a body coil. Magnetic spins of the imaging object are excited, and a k-space data set 148 for the target coil is populated with low resolution, full FOV k-space calibration data 150 acquired in the target coil having a diagnostically useful contrast. In an embodiment of the invention, the source coils and the target coil acquire their respective data 146, 150 from the same excitation of the magnetic spins. Alternatively, the target coil may acquire calibration data 150 from an excitation of the magnetic spins before or after the excitation of the magnetic spins from which the source coils acquire data for the reduced FOV data set 146.

Synthesis or linear combination weights 152 are calculated from a relationship between the data in the reduced FOV data set 146 and the calibration data 150 as described above with respect to FIG. 3. In this manner, linear combination weights 152 are generated that will synthesize k-space data on the target coil from k-space data on the source coils. The weights 152 are used to construct a full resolution, full FOV k-space data set 154 for the target coil. In an embodiment of the invention, k-space data set 154 is generated from a linear combination of the application of the weights 152 to each k-space data set 144. Thereafter, a 2D Fourier transform is applied to k-space data set 154 to reconstruct an image 156.

It is contemplated that an embodiment of technique 142 may include multiple target coils (not shown). Accordingly, as described with respect to FIG. 4, each target coil of technique 142 would have a corresponding k-space data set 148 populated with calibration data 150 for that target coil. Additionally, the synthesis weights 152 would include weights calculated from a relationship between the data in the reduced FOV data set 146 and the calibration data 150 of each target coil. A full resolution, full FOV k-space data set 154 for each target coil would also be constructed to which a 2D Fourier transform would be applied to reconstruct an image 156 for each target coil. Furthermore, the images 156 from each target coil may be combined into a single, composite image (not shown) using one of a number of known summation techniques, e.g., sum of squares.

In another embodiment, it is envisioned that unacquired MR data is filled-in in hybrid space. "Hybrid space" refers to the intermediate matrix that results in the performance of one of the 1D Fourier transforms that comprise the 2D Fourier transform that converts k-space to image space. In other words, in 2D Fourier imaging, one Fourier transform is performed in the frequency encoding direction and another Fourier transform is performed in the phase encoding direction. The matrix after the first 1D Fourier transform is considered a "hybrid space". That is, the data is no longer "untransformed" and therefore not considered k-space; however, the data, as a whole, is not yet in the spatial domain and, thus, not in "image space".

Upon generation of the linear coefficient weights 110, 136, 152 as described above with respect to FIGS. 3-6, the weights 110, 136, 152 are transformed into hybrid-space weights to be applied to imaging data that has been similarly transformed into that space. That is, the linear coefficient weights 110, 136, 152 are Fourier transformed in one dimension (typically the frequency-encode dimension) to form a set of hybrid weights. The k-space data sets 112, 126, 144 are Fourier transformed in the one dimension to generate hybrid-space data sets, where missing data in the hybrid spaces are synthesized efficiently from the acquired imaging and calibration data in hybrid space so as to yield complete hybrid spaces. The hybrid spaces are then reconstructed to respective coil images 118, 140, 156, by application of a 1D Fourier transformation in the phase encoding direction. This results in a "coil" image 118, 140, 156 for each target or synthesis coil.

In yet another embodiment, it is envisioned that the weights 110, 136, 152 are transformed into image-space weights to be applied to imaging data that has been similarly transformed into that space. That is, the linear coefficient weights 110, 136, 152 are Fourier transformed in two dimensions (i.e., the frequency- and phase-encode dimensions) to form a set of image weights. The k-space data sets 112, 126, 144 are Fourier transformed in the two dimensions to generate image-space data sets, where missing data in the image spaces are synthesized efficiently from the acquired imaging and calibration data in image space so as to yield complete image spaces forming respective coil images 118, 140, 156 for each target or synthesis coil.

An advantage of an embodiment of the invention as described above is that a single target-coil data set, rather than multiple source-coil data sets, can be reconstructed, resulting in considerable computation savings. As such, a cost savings may be realized from reduced hardware/processing demands. The target coil calibration data can be acquired with different SNR and contrast as the accelerated scan. Additionally, when using a body coil for the target coil, which has a relatively homogenous signal response, its reconstructed image will inherently compensate for surface coil sensitivity variations, which may reduce coil sensitivity shading.

A technical contribution for the disclosed method and apparatus is that it provides for a computer implemented technique for sampling and reconstructing an image of an imaging volume with multiple receiver coils to accelerate data acquisition.

In accordance with an embodiment of the invention, an MRI apparatus includes a magnetic resonance imaging (MRI) system having a plurality of gradient coils positioned about a bore of a magnet. The MRI apparatus also includes an RF transceiver system to acquire MR data from an RF coil assembly. The RF coil assembly includes a plurality of RF source coils and an RF target coil separate from the plurality of RF source coils. A computer is included and programmed to acquire MR data of an imaging object from each of the plurality of RF source coils and to acquire MR data of the imaging object from the RF target coil. The computer is further programmed to calculate a set of weights based on a relationship between MR data acquired from each RF source coil and MR data acquired from the RF target coil and to reconstruct an image based on an application of the set of weights to at least a portion of the MR data acquired from each of the plurality of RF source coils.

In accordance with another embodiment of the invention, a method of MR imaging includes acquiring a first set of MR calibration signals from excited nuclei in a subject to be scanned from each of a plurality of RF analysis coils and acquiring a second set of MR calibration signals from the excited nuclei from an RF synthesis coil, wherein the RF synthesis coil is not one of the plurality of RF analysis coils. The method also includes generating a plurality of synthesis weights based on the relationship between the first and second sets of MR calibration signals. A set of accelerated MR data is acquired from the excited nuclei from each of the plurality of RF analysis coils. The method also includes reconstructing an image from an application of the plurality of synthesis weights to the sets of accelerated MR data.

In accordance with another embodiment of the invention, a computer readable storage medium having a program stored thereon that when executed by a processor causes the processor to access a first set of MR data of an imaging object acquired from each of at least two RF source coils and access a second set of MR data of the imaging object acquired from each of at least one RF target coil, the at least one RF target coil different than the at least two RF source coils. Each first set of MR data is related to each second set of MR data to calculate a series of weights, and the series of weights is stored in memory.

The present invention has been described in terms of the preferred embodiment, and it is recognized that equivalents, alternatives, and modifications, aside from those expressly stated, are possible and within the scope of the appending claims.

What is claimed is:
1. An MRI apparatus comprising:
a magnetic resonance imaging (MRI) system having a plurality of gradient coils positioned about a bore of a magnet;
an RF transceiver system to acquire MR data from an RF coil assembly, the RF coil assembly comprising:
a plurality of RF source coils; and
an RF target coil separate from the plurality of RF source coils; and
a computer programmed to:

acquire MR data of an imaging object from each of the plurality of RF source coils, wherein at least a portion of the MR data is accelerated MR data;

acquire MR data of the imaging object from the RF target coil;

calculate a set of weights based on a relationship between MR data acquired from each RF source coil and MR data acquired from the RF target coil; and calculate a full field-of-view MR data set for the RF target coil based on an application of the set of weights to at least a portion of the MR data acquired from at least one of the plurality of RF source coils, wherein at least one dimension of the full field-of-view MR data set is in the frequency domain; and reconstruct an image based on the calculated full field-of-view MR data set.

2. The MRI apparatus of claim 1 wherein the computer, in being programmed to acquire MR data of the imaging object from the RF target coil, is programmed to acquire low resolution MR data from a full field-of-view (FOV) from the RF target coil.

3. The MRI apparatus of claim 2 wherein the computer, in being programmed to acquire MR data of the imaging object from each of the plurality of RF source coils, is further programmed to acquire a set of reduced FOV MR data of the imaging object from each of the plurality of RF source coils.

4. The MRI apparatus of claim 3 wherein the computer, in being programmed to acquire MR data of the imaging object from each of the plurality of RF source coils, is further programmed to acquire autocalibration MR data of the imaging object from each of the plurality of RF source coils.

5. The MRI apparatus of claim 4 wherein the autocalibration MR data comprises low resolution MR data from the full FOV.

6. The MRI apparatus of claim 4 wherein the computer, in being programmed to calculate a set of weights, is programmed to calculate the set of weights based on the relationship between the autocalibration MR data from each of the plurality of RF source coils and the low resolution MR data from the RF target coil.

7. The MRI apparatus of claim 6 wherein the computer is further programmed to apply the set of weights to the set of reduced FOV MR data from each of the plurality of RF source coils and construct a single, full FOV MR data set therefrom.

8. The MRI apparatus of claim 7 wherein the computer, in being programmed to reconstruct an image, is programmed to reconstruct an image from the single, full FOV MR data set.

9. The MRI apparatus of claim 3 wherein the computer, in being programmed to calculate a set of weights, is programmed to calculate the set of weights based on a relationship between a portion of the reduced FOV MR data from each of the plurality of RF source coils and the low resolution MR data from the RF target coil.

10. The MRI apparatus of claim 9 wherein the computer is further programmed to apply the set of weights to the set of reduced FOV MR data from each of the plurality of RF source coils and construct a single, full FOV MR data set therefrom.

11. The MRI apparatus of claim 10 wherein the computer, in being programmed to reconstruct an image, is programmed to reconstruct an image from the single, full FOV MR data set.

12. The MRI apparatus of claim 2 wherein the RF target coil is a body coil.

13. A method of MR imaging comprising:

acquiring a first set of MR calibration signals from excited nuclei in a subject to be scanned from each of a plurality of RF analysis coils;

acquiring a second set of MR calibration signals from the excited nuclei from an RF synthesis coil, wherein the RF synthesis coil is not one of the plurality of RF analysis coils;

generating a plurality of synthesis weights based on the relationship between the first and second sets of MR calibration signals;

acquiring a set of accelerated MR data from the excited nuclei from each of the plurality of RF analysis coils; and reconstructing an image from an application of the plurality of synthesis weights to the sets of accelerated MR data.

14. The method of claim 13 wherein acquiring the second set of MR calibration signals comprises acquiring low resolution MR data from a full FOV.

15. The method of claim 14 wherein acquiring the first set of MR calibration signals comprises acquiring low resolution MR data from the full FOV.

16. The method of claim 13 wherein generating a plurality of synthesis weights comprises fitting the first set of MR calibration signals from each of the plurality of RF analysis coils to the second set of MR calibration signals.

17. The method of claim 13 wherein generating a plurality of synthesis weights comprises calculating a plurality of correlation values between the first set of MR calibration signals and second set of MR calibration signals.

18. The method of claim 13 further comprising:

applying the plurality of synthesis weights to the sets of accelerated MR data to construct a complete k-space data set; and wherein reconstructing comprises performing a 2D Fourier transform of the complete k-space data set.

19. The method of claim 13 further comprising:

performing a 1D Fourier transform of the plurality of synthesis weights;

performing a 1D Fourier transform of the sets of accelerated MR data;

applying the plurality of synthesis weights to the sets of accelerated MR data to construct a complete hybrid-space data set; and wherein reconstructing comprises performing a 1D Fourier transform of the complete hybrid-space data set.

20. The method of claim 13 further comprising:

performing a 2D Fourier transform of the plurality of synthesis weights;

performing a 2D Fourier transform of the sets of accelerated MR data; and applying the plurality of synthesis weights to the sets of accelerated MR data to reconstruct a complete image.

21. The method of claim 13 wherein the set of accelerated MR data includes the first set of MR calibration signals.

22. The method of claim 13 wherein the RF synthesis coil is a body coil.

23. A computer readable storage medium having a program stored thereon that when executed by a processor causes the processor to:

access a first set of MR data of an imaging object acquired from each of at least two RF source coils, wherein at least a portion of the first set of MR data is accelerated MR data;

access a second set of MR data of the imaging object acquired from each of at least one RF target coil, the at least one RF target coil different than the at least two RF source coils;

relate each first set of MR data to each second set of MR data to calculate a series of linear combination weights; and store the series of linear combination weights in memory.

24. The computer readable storage medium of claim 23 wherein program further causes the processor to:

apply the series of linear combination weights to a partially filled k-space data set from each of the at least two RF source coils to generate a complete k-space data set; and reconstruct an image from the complete k-space data set.

25. The computer readable storage medium of claim 23 wherein program further causes the processor to:

transform the series of linear combination weights into hybrid space;

apply the transformed series of linear combination weights to a partially filled hybrid-space data set from each of the at least two RF source coils to generate a complete hybrid-space data set; and reconstruct an image from the complete hybrid-space data set.

26. The computer readable storage medium of claim 23 wherein program further causes the processor to:

transform the series of linear combination weights into image space;

apply the transformed series of linear combination weights to a partially filled image-space data set from each of the at least two RF source coils to reconstruct an image.

27. The computer readable storage medium of claim 23 wherein the at least one RF target coil comprises multiple RF target coils, and wherein the at least two RF source coils comprise a greater quantity of RF source coils than a quantity of the multiple RF target coils.

* * * * *

UNITED STATES PATENT AND TRADEMARK OFFICE
CERTIFICATE OF CORRECTION

| | | |
|---|---|---|
| PATENT NO. | : 7,492,153 B2 | Page 1 of 1 |
| APPLICATION NO. | : 11/757571 | |
| DATED | : February 17, 2009 | |
| INVENTOR(S) | : Brau et al. | |

It is certified that error appears in the above-identified patent and that said Letters Patent is hereby corrected as shown below:

Col. 1, line 5, insert the following statement:

-- GOVERNMENT LICENSE RIGHTS

This invention was made with Government support under contracts HL039297 and HL075803 awarded by the National Institutes of Health. The Government has certain rights in this invention. --

Signed and Sealed this
Fifteenth Day of March, 2011

David J. Kappos
*Director of the United States Patent and Trademark Office*